(12) United States Patent
Ireland

(10) Patent No.: US 6,420,257 B2
(45) Date of Patent: Jul. 16, 2002

(54) PROCESS FOR FORMING TRENCHES AND CONTACTS DURING THE FORMATION OF A SEMICONDUCTOR MEMORY DEVICE

(75) Inventor: Philip J. Ireland, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/746,899

(22) Filed: Dec. 22, 2000

Related U.S. Application Data

(63) Continuation of application No. 08/556,345, filed on Nov. 13, 1995, now Pat. No. 6,165,889, which is a continuation of application No. 08/319,217, filed on Oct. 6, 1994, now Pat. No. 5,466,639.

(51) Int. Cl.$^7$ ......................................... H01L 21/4763
(52) U.S. Cl. ..................................................... 438/618
(58) Field of Search ................................. 438/618–633, 438/672

(56) References Cited

U.S. PATENT DOCUMENTS

| | | | |
|---|---|---|---|
| 4,997,789 A | 3/1991 | Keller et al. | 437/192 |
| 5,055,423 A | 10/1991 | Smith et al. | 437/187 |
| 5,246,882 A | 9/1993 | Hartmann | 437/195 |
| 5,354,711 A | 10/1994 | Heitzmann et al. | 437/182 |
| 5,397,908 A | 3/1995 | Dennison et al. | 257/306 |
| 5,403,781 A | 4/1995 | Matsumoto et al. | 437/195 |
| 5,413,961 A | 5/1995 | Kim | 437/195 |
| 5,500,080 A | 3/1996 | Choi | 156/644.1 |

OTHER PUBLICATIONS

Ueno et al., "A Quarter–Micron Planarized Interconnection Technology with Self–Aligned Plug," Apr., 1992 IEEE, pp. 305–308.
Kaanta et al., "Dual Damascene: A ULSI Wiring Technology," Jun. 11–12, 1991, IEEE, VMIC Conference, pp. 144–152.

Primary Examiner—David Nelms
Assistant Examiner—Thao P Le

(57) ABSTRACT

A method of forming a contact to a semiconductor memory device feature comprises the steps of forming a first oxide layer over a feature such as a semiconductor substrate or a conductive line or plate, then forming a hard mask over the first oxide layer. A first patterned resist layer is formed on the hard mask, then the hard mask is patterned using the first resist layer as a pattern. The first resist layer is removed and a second oxide layer is formed over the hard mask. A second patterned resist layer is formed over the second oxide layer and the second oxide layer is etched using the second resist layer as a pattern while, during a single etch step, the first oxide layer is etched using the hard mask as a pattern, the hard mask functioning as an etch stop. The second resist layer is removed and a conductive layer is formed over the second dielectric layer and the hard mask, with the conductive layer (including any adhesion layers required to adhere the conductive layer to the underlying layer) contacting the feature and forming contacts. The conductive layer is then planarized.

16 Claims, 4 Drawing Sheets

PROCESS FOR FORMING TRENCHES AND CONTACTS DURING THE FORMATION OF A SEMICONDUCTOR MEMORY DEVICE

PRIORITY INFORMATION

This is a continuation of application Ser. No. 08/556,345 filed Nov. 13, 1995 and issued Dec. 26, 2000 as U.S. Pat. No. 6,165,889, which was a continuation of application Ser. No. 08/319,217 filed Oct. 6, 1994 and issued Nov. 14, 1995 as U.S. Pat. No. 5,466,639.

FIELD OF THE INVENTION

This invention relates to the field of semiconductor manufacture, and more specifically to the formation of contacts and trenches in a dielectric material.

BACKGROUND OF THE INVENTION

During the formation of a semiconductor device, layers of various materials such as dielectrics, masks, metals, doped polycrystalline silicon, and photoresist are formed over a semiconductor substrate. Contacts through dielectric materials to the semiconductor substrate are typically required during the formation of semiconductor devices, such as memory devices and microprocessors. Contacts to features other than the substrate, such as word lines and other structures, are also commonly performed.

One process to form a contact to a semiconductor substrate or other features through a dielectric includes the steps of forming a dielectric layer over the semiconductor substrate, then forming a first patterned layer of photoresist (resist) over the dielectric. An etch defines a contact through the dielectric to the substrate, and the resist layer is then removed.

The contacts are often connected with word lines or bit lines. To form the word or bit lines a second layer of resist is patterned over the dielectric layer leaving the contacts exposed, and also leaving exposed an area parallel and overlying the contacts. The dielectric is again etched, although the dielectric is not etched completely, thereby creating a trench in the dielectric but no additional contacts to the substrate. A layer of conductive material such as metal is then blanket deposited over the surface of the dielectric, and the wafer is planarized to leave conductive material within the contacts and within the trench.

Various problems are associated with processes such as the one described above. One problem is that the dielectric is etched to expose the substrate and to form contacts, then a second patterned resist layer is subsequently formed over the dielectric thus filling the contacts with resist. Due to the small sizes of the contacts in the dielectric, it can be difficult to completely remove the resist from the contacts in the dielectric, and thus the conductive layer which contacts the substrate may not make adequate electrical contact.

One method to solve the problem associated with resist filling the contact has been to first etch a contact in a first dielectric layer, then to deposit and planarize a first metal layer to form a metal plug to the substrate. A second dielectric layer having a trench is patterned over the first metal layer and over the first dielectric layer, then a second metal layer is formed over the second dielectric layer and then planarized. This process, however, requires the formation and planarization of two metal layers, thus adding additional steps and an additional metal-to-metal interface, which can be difficult to form reliably.

A process which can be accomplished by the deposition of a single metal layer and which does not require the formation of a resist layer within the contact to the substrate would be desirable.

SUMMARY OF THE INVENTION

A method of forming a semiconductor device comprises the steps of forming a first dielectric layer over a feature such as a semiconductor substrate or a conductive line or plate, then forming a hard mask over the first dielectric layer. A first patterned resist layer is formed directly on the hard mask, and the hard mask is patterned using the first resist layer as a pattern. The first resist layer is removed.

Next, a second dielectric. is formed over the hard mask, and a second patterned resist layer is formed over the second dielectric layer. The second dielectric layer is etched using the second resist layer as a pattern. Finally, the first dielectric layer is etched using the hard mask as a pattern.

Objects and advantages will become apparent to those skilled in the art from the following detailed description read in conjunction with the appended claims and the drawings attached hereto.

It should be emphasized that the drawings herein are not to scale but are merely schematic representations and are not intended to portray the specific parameters or the structural details of the invention, which can be determined by one of skill in the art by examination of the information herein.

DETAILED DESCRIPTION OF THE INVENTION

Figure 1:
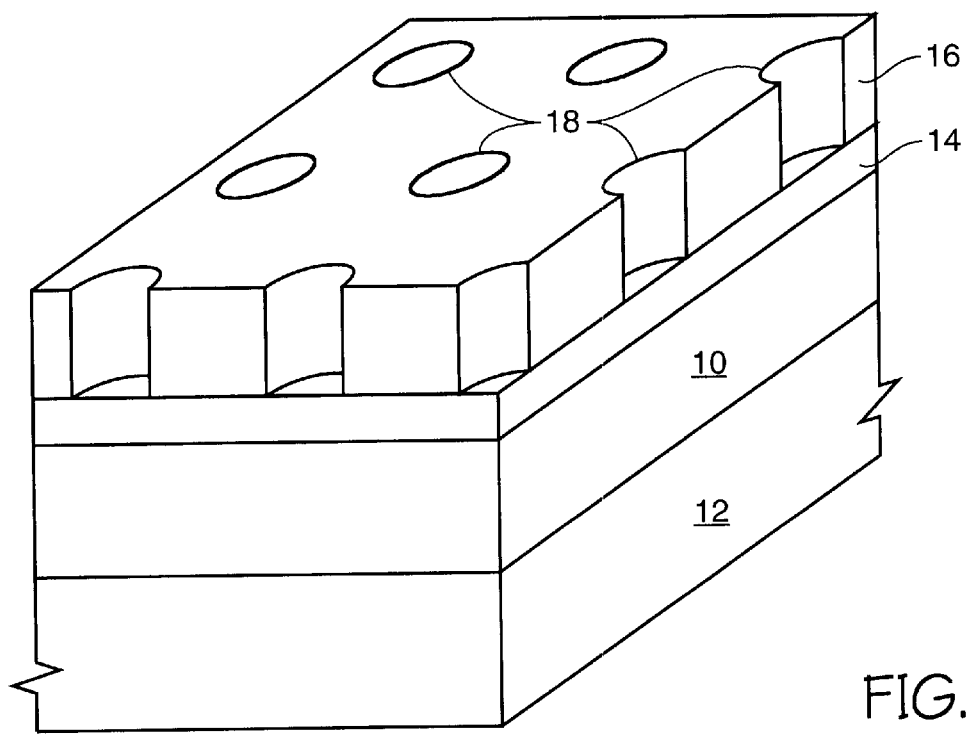
FIGS. 1–8 are isometric views showing one possible embodiment of the inventive process.

Referring to FIG. 1, a method of forming a semiconductor device comprises the steps of forming a first dielectric layer 10, such as an oxide such as borophosphosilicate glass (BPSG), over a semiconductor substrate 12 such as a wafer of silicon or gallium arsenide. A hard mask 14, such as a thermal layer of silicon nitride, is then formed over the first dielectric layer 10. A hard mask, for purposes of this disclosure, is a layer which can be etched selective to the underlying dielectric layer. Various materials other than thermal silicon nitride may be used for the hard mask.

Figure 2:
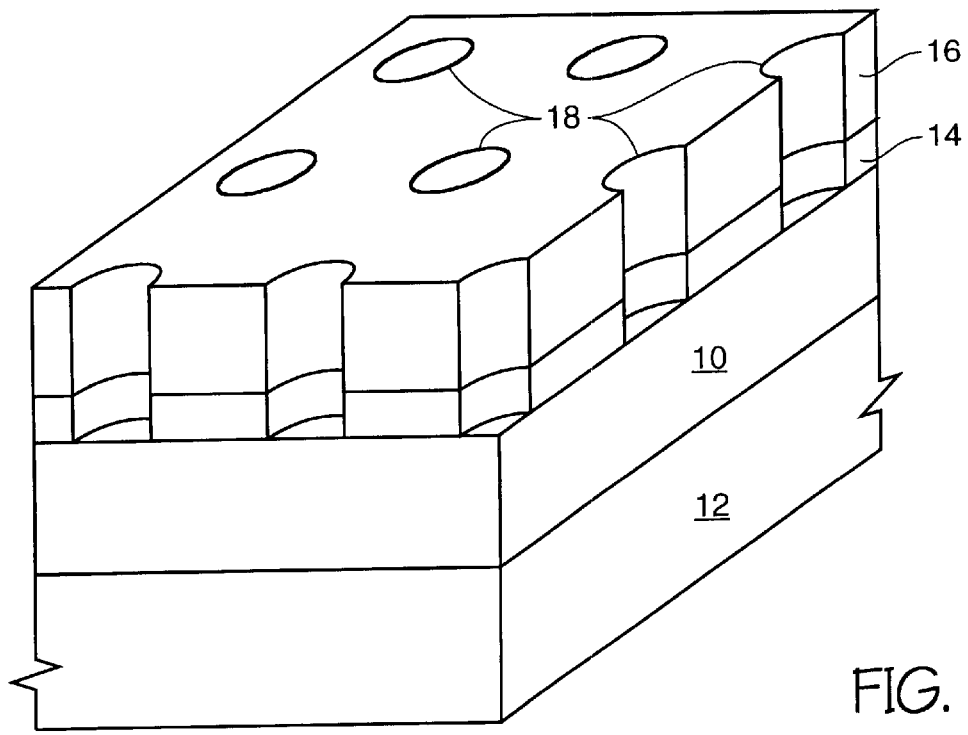
Figure 3:
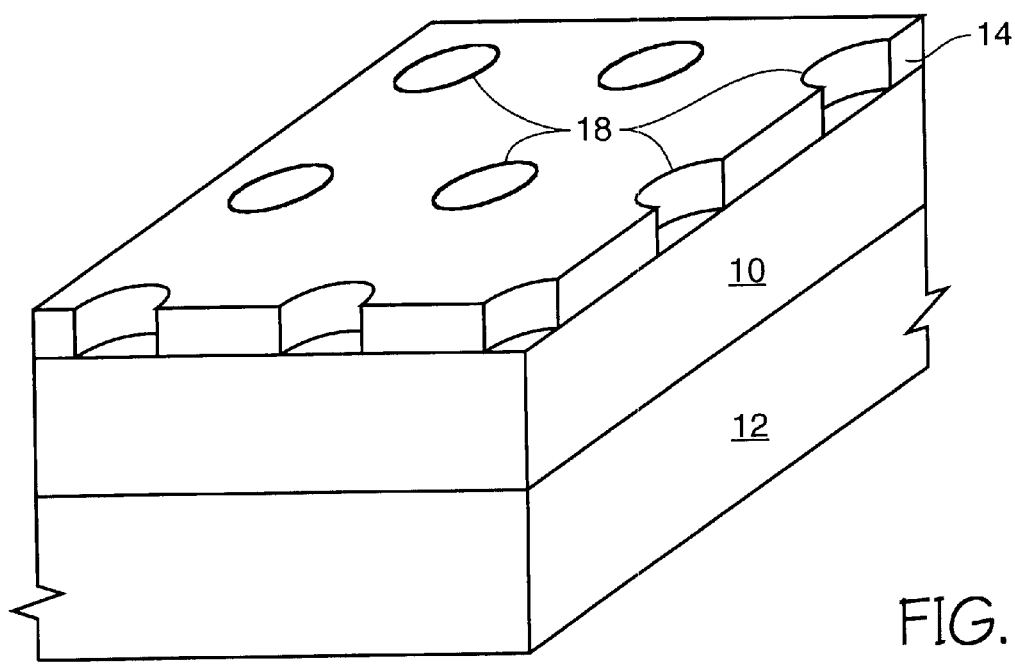

Next, a first patterned layer of photoresist (resist) 16 having contact locations 18 is formed on the hard mask 14, and the hard mask is patterned using the first resist layer as a pattern as shown in FIG. 2 which leaves the contact locations 18 etched in the hard mask 14. The patterning of the hard mask 14 can be accomplished by any means which removes the hard mask and leaves the underlying dielectric layer substantially intact. Either a wet or dry etch using materials known in the art would be sufficient, depending on the hard mask and the dielectric layers used. The first resist layer 16 is then stripped as shown in FIG. 3.

Figure 4:
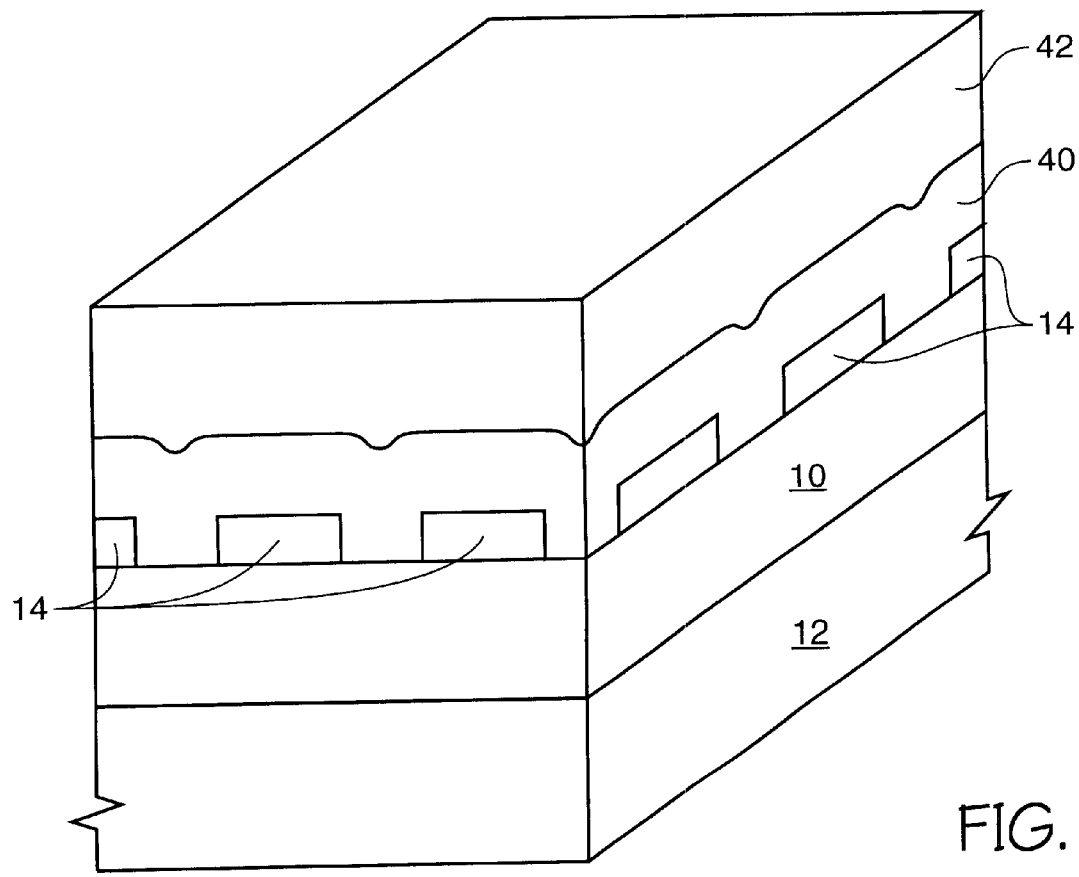
Figure 5:
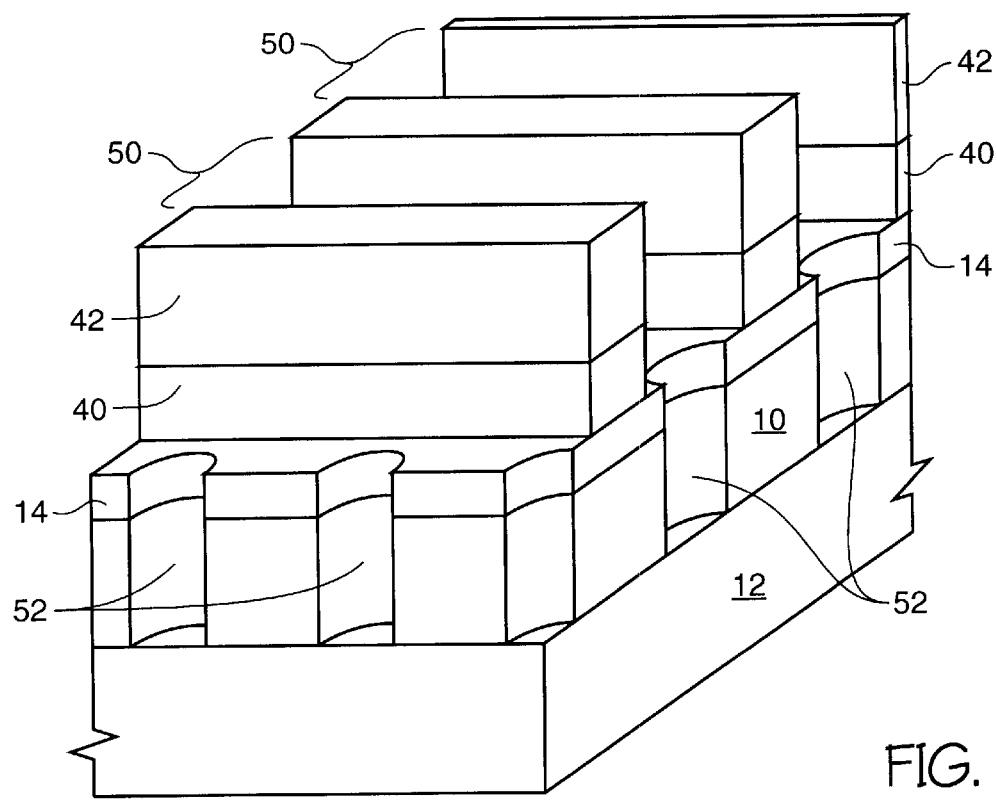

As shown in FIG. 4, a second dielectric layer 40 is formed over the hard mask 14, and a second resist layer 42 is formed over the second dielectric layer 40. As shown in FIG. 5, the resist 42 is patterned and the second dielectric layer 40 is etched using the second resist layer 42 as a pattern, which forms a trench 50 in the second dielectric layer 40. The hard mask 14 functions as an etch stop layer, thereby preventing the trench 50 from being etched into the first dielectric layer 10. The first dielectric layer 10 is then etched using the hard mask 14 as a pattern to form a contact 52 in the first dielectric layer 10 to the substrate 12. The etching of the first 10 and second 40 dielectric layers can be performed during two different etch steps, or it may be preferable to etch the two layers during a single etch step.

Figure 6:
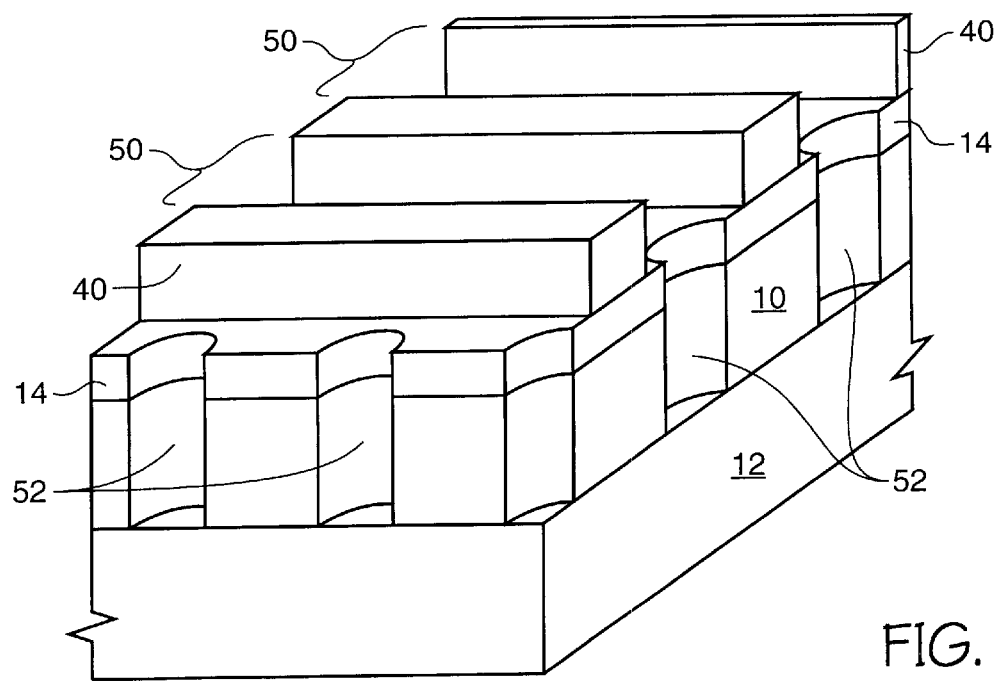
Figure 7:
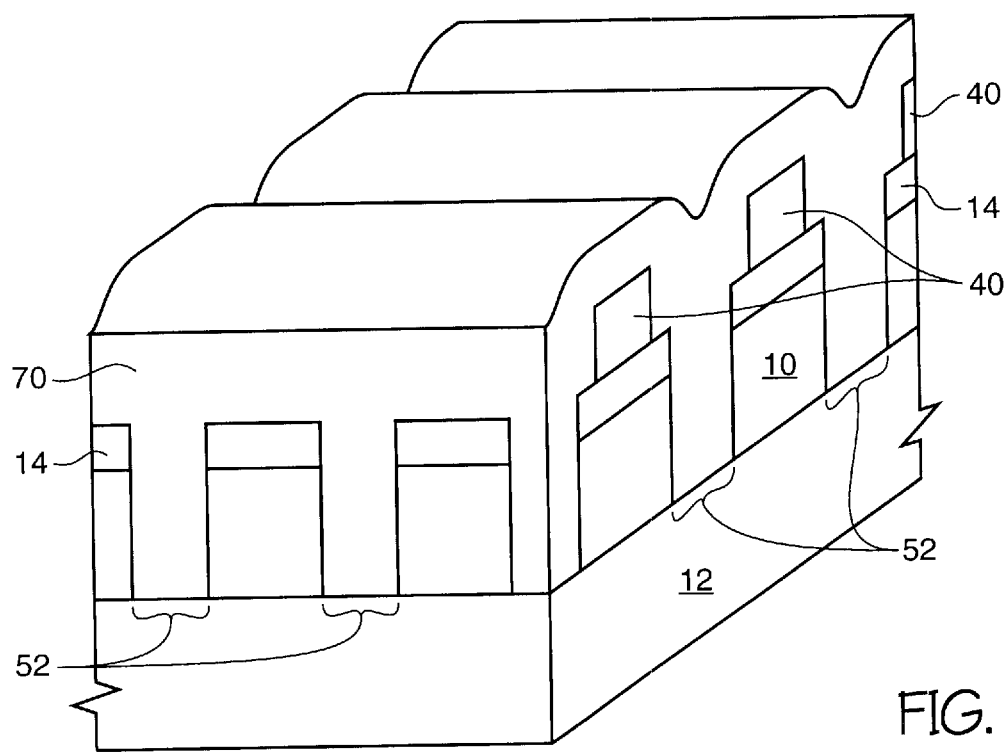
Figure 8:
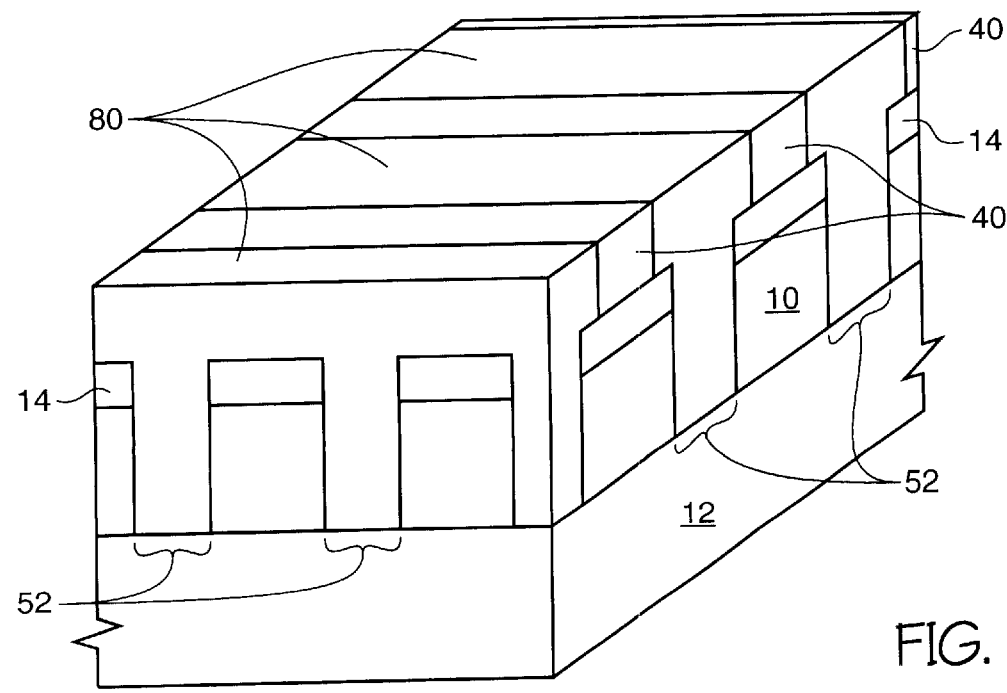

In any case, the second resist layer 42 is removed as shown in FIG. 6, and, referring to FIG. 7, a conductive layer 70 (including any adhesion layers, not shown, required to adhere the conductive layer to the underlying layer), such as a metal layer is formed over the hard mask 14 and over the first 10 and second 40 dielectric layers. The conductive layer 70 fills the contact 52 in the first dielectric layer 10 and the trench 50 in the second dielectric layer 40. Planarizing the conductive layer 70 electrically isolates one trench from the next, to form conductive lines 80 such as word lines or bit lines as shown in FIG. 8. The conductive layer can be planarized by any workable means, such as by chemical mechanical polish, a dry etch, etc.

While this invention has been described with reference to illustrative embodiments, this description is not meant to be construed in a limiting sense. Various modifications of the illustrative embodiments, as well as additional embodiments of the invention, will be apparent to persons skilled in the art upon reference to this description. For example, although the formation of a contact to a semiconductor substrate is shown, the process can be used to form a contact to any feature, such as a conductive line or plate. It is therefore contemplated that the appended claims will cover any such modifications or embodiments as fall within the true scope of the invention.

What is claimed is:

1. A method for forming at least one contact to at least one semiconductor device feature comprising:

forming a first patterned mask over a first dielectric layer;

forming a second dielectric layer over said first patterned mask and a second patterned mask over said second dielectric layer;

subsequent to forming said second patterned mask, etching said first and second dielectric layers respectively using said first and second masks as patterns to form openings therein;

subsequent to said step of etching said first and second dielectric layers, forming a conductive layer over said second dielectric layer and within said openings; and planarizing said conductive layer to a surface of said second dielectric layer.

2. The method of claim 1 further comprising forming said second mask of photoresist.

3. The method of claim 1 wherein said etching is performed in a single etch step.

4. The method of claim 1 further comprising:

forming said conductive layer as a single metal layer; and defining at least one conductive line during said planarizing which is electrically coupled with at least one contact extending to said semiconductor device feature.

5. The method of claim 4 further comprising forming at least a portion of a bit line during said defining of said at least one conductive line.

6. The method of claim 4 further comprising forming at least a portion of a word line during said defining of said at least one conductive line.

7. The method of claim 1 further comprising using said second mask as an etch stop layer during said etching.

8. A method for forming a contact to a semiconductor device feature comprising:

forming a patterned mask over a first dielectric layer;

forming a second dielectric layer over said mask and a patterned photoresist layer over said second dielectric layer;

subsequent to forming said patterned photoresist layer, etching said first and second dielectric layers respectively using said mask and said photoresist layer as patterns;

subsequent to said etching, forming a conductive layer over said second dielectric layer such that said conductive layer contacts said semiconductor device feature; and planarizing said conductive layer to a surface of said second dielectric layer.

9. The method of claim 8 wherein said etching is performed in a single etch step.

10. The method of claim 8 further comprising:

forming said conductive layer as a single metal layer; and defining at least one conductive line during said planarizing which is electrically coupled with at least one contact extending to said semiconductor device feature.

11. The method of claim 10 further comprising forming at least a portion of a bit line during said defining of said at least one conductive line.

12. The method of claim 10 further comprising forming at least a portion of a word line during said defining of said at least one conductive line.

13. The method of claim 8 further comprising using said second mask as an etch stop layer during said etching.

14. A method for forming a contact to a semiconductor device feature and a conductive line, comprising:

forming a contact aperture-defining first patterned mask over a first dielectric layer;

forming a second dielectric layer over said first mask and a line aperture-defining second patterned mask over said second dielectric layer;

subsequent to forming said second patterned mask, etching said first and second dielectric layers using said first and second masks respectively as patterns to form a contact aperture region in said first dielectric layer and a line aperture region in said second dielectric layer;

subsequent to said etching, forming a conductive layer over said second dielectric layer and within said contact aperture region and within said line aperture region; and planarizing said conductive layer to a surface of said second dielectric layer.

15. The method of claim 14 wherein said etching is performed in a single etch step.

16. The method of claim 14 further comprising:

forming said conductive layer as a single metal layer; and defining at least one conductive line during said planarizing which is electrically coupled with at least one contact extending to said semiconductor device feature.

* * * * *